United States Patent [19]

Emmelius et al.

[11] Patent Number: 5,264,324

[45] Date of Patent: Nov. 23, 1993

[54] RADIATION-POLYMERIZABLE MIXTURE AND PROCESS FOR PRODUCING A SOLDER RESIST MASK

[75] Inventors: Michael Emmelius, Mainz; Walter Herwig, Bad Soden; Kurt Erbes, Floersheim; Rudolf Decker, Bodenheim, all of Fed. Rep. of Germany

[73] Assignee: Hoechst Aktiengesellshaft, Frankfurt/am Main, Fed. Rep. of Germany

[21] Appl. No.: 585,642

[22] Filed: Sep. 20, 1990

[30] Foreign Application Priority Data

Sep. 21, 1989 [DE] Fed. Rep. of Germany ....... 3931467

[51] Int. Cl.$^5$ ................................................ G03C 1/68
[52] U.S. Cl. .................................. 430/280; 430/273; 430/311; 430/325; 430/935
[58] Field of Search ............... 430/280, 910; 522/71, 522/95, 117, 121

[56] References Cited

U.S. PATENT DOCUMENTS

| | | | |
|---|---|---|---|
| 3,776,729 | 12/1973 | Levy et al. | 96/35.1 |
| 3,804,631 | 4/1974 | Faust | 430/916 X |
| 3,887,450 | 6/1975 | Gilano et al. | 522/117 X |
| 3,930,865 | 1/1976 | Faust et al. | 522/121 X |
| 4,230,793 | 10/1980 | Losert et al. | 430/315 |
| 4,278,752 | 7/1981 | Gervay et al. | 430/281 |
| 4,390,615 | 6/1983 | Courtney et al. | 430/280 X |
| 4,438,189 | 3/1984 | Geissler et al. | 430/280 |
| 4,485,166 | 11/1984 | Herwig et al. | 430/260 |
| 4,544,623 | 10/1985 | Audykowski et al. | 430/280 |
| 4,559,292 | 12/1985 | Geissler et al. | 430/256 |

FOREIGN PATENT DOCUMENTS

| | | | |
|---|---|---|---|
| 0015004 | 9/1980 | European Pat. Off. | |
| 0157374 | 10/1985 | European Pat. Off. | 430/280 |
| 0273729 | 7/1988 | European Pat. Off. | |
| 0280295 | 8/1988 | European Pat. Off. | |
| 0283990 | 9/1988 | European Pat. Off. | |
| 0113409 | 2/1989 | European Pat. Off. | |
| 89/05476 | 6/1989 | PCT Int'l Appl. | |
| 2119810 | 11/1983 | United Kingdom | |

Primary Examiner—Marion E. McCamish
Assistant Examiner—S. Rosasco
Attorney, Agent, or Firm—Foley & Lardner

[57] ABSTRACT

The present invention relates to a radiation-polymerizable mixture which includes a polymerizable compound, a polymeric binder which has units of methacrylic acid, a methacrylic acid ester and a styrene, the latter in a proportion of 40 to 65% by weight, a finely divided mineral pigment on a silicic acid or silicate basis, a photopolymerization initiator, a compound having at least two epoxy groups in its molecule and a thermal hardener for epoxy groups. The mixture is advantageous, in particular, for producing solder masks and can be cured after exposure to an image and development by heating to about 80° to 150° C. to form a stencil which is resistant under soldering conditions.

18 Claims, 1 Drawing Sheet

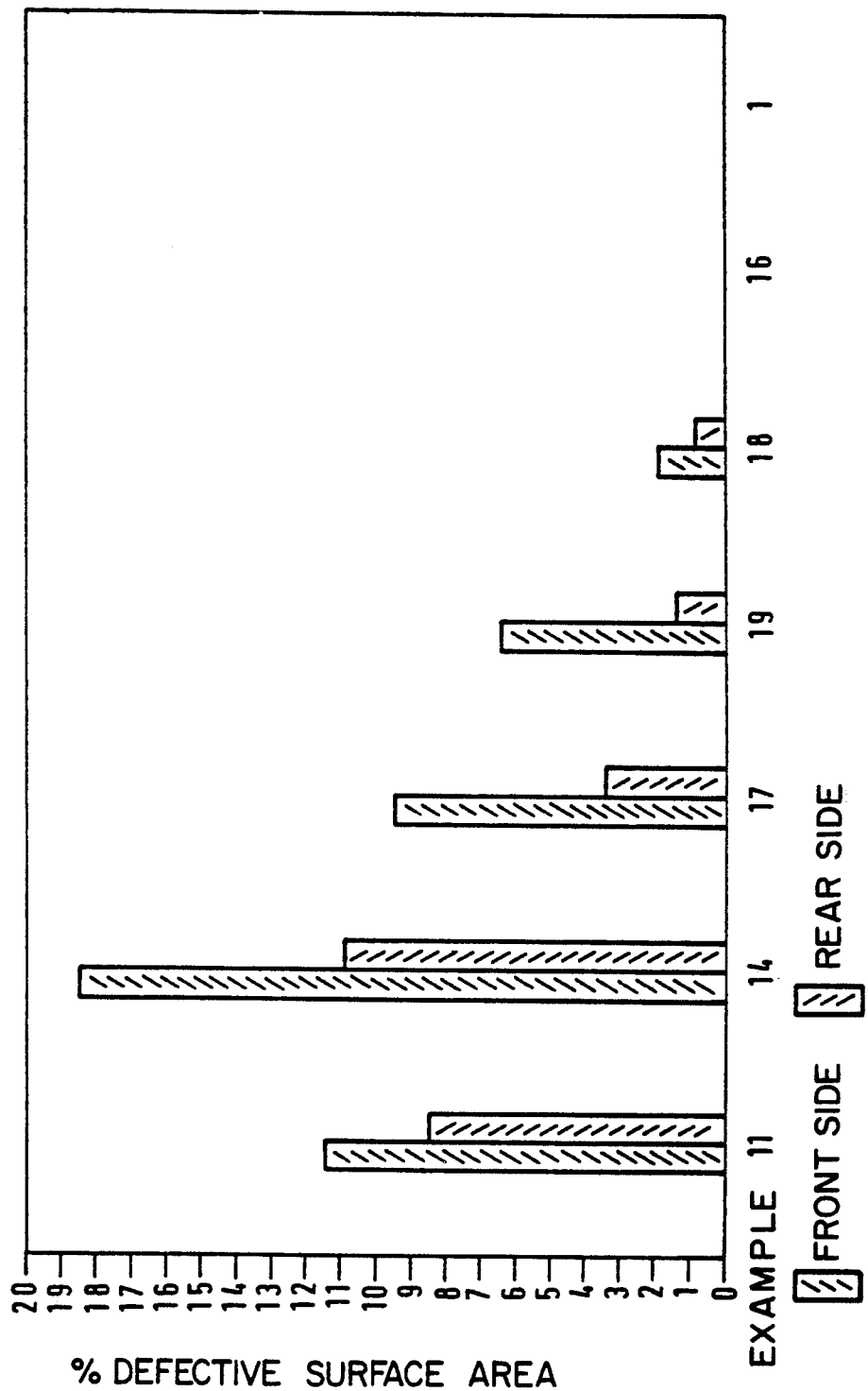

RADIATION-POLYMERIZABLE MIXTURE AND PROCESS FOR PRODUCING A SOLDER RESIST MASK

BACKGROUND OF THE INVENTION

The present invention relates to a radiation-polymerizable mixture which is used to produce solder resist masks.

It is known to produce solder resist masks on conductor boards by a photoresist technique. Similar to the process used for the production of printed circuits, photoresist solutions are in this case deposited on patterned conductor boards, dried and cured by exposure in accordance with an image at those areas at which the conductor board is to be masked. The photoresist mask is obtained by washing out the unexposed areas of the layer. The photoresist layer can also be deposited by a dry resist process by laminating a prefabricated thermoplastic layer onto the conductor board.

Conductor boards having single-sided, double-sided, and especially plated-through construction are provided with photoresist masks before they are delivered to soldering processes. Typically, a distinction is made between two important types of mechanized soldering as follows:

1. Hot air levelling process—In this process an unassembled, plated-through conductor board produced as a pure copper circuit is formed with a solder resist mask in such a way that the copper-plated drilled holes remain free of photoresist or are uncovered. These boards are then immersed in liquid solder, the free copper elements are coated in a firmly adhering manner with the solder and then blown free with hot compressed air in the hole regions while still hot.
2. Wave or flow soldering—In this process, conductor boards having fitted components are soldered by passing them mechanically over liquid solder surfaces.

Since pure copper techniques have recently become increasingly improved and in addition, plated-through circuits are used on a wide scale, fully functional conductor boards completely fitted with components have frequently been through the two above-described soldering processes. Two solderings naturally impose high requirements on the thermal resistance of a solder resist mask. These requirements are increasingly more difficult to meet, since a number of other demands have to be satisfied.

Materials suitable for the production of solder resist masks are described, for example, in DE-A 2,747,947. These materials are photopolymerizable layers which contain a certain amount of bound halogen to improve the flame retardation. EP-A 15,004 describes a similar material which can be developed in the dry state by mechanical separation of exposed and unexposed layer regions known as the "peel-apart process". EP-A 2040 describes a photocurable material intended for the same purpose in which certain epoxy resins are used as photosensitive compounds.

In EP-B 0,113,409, a photosensitive layer is deposited over a screen printing stencil and, therefore, the photopolymerization serves only to cure the mask and is not used to produce an image.

U.S. Pat. No. 3,776,729 describes a mixture which consists essentially of photopolymerizable acrylates and thermally crosslinkable epoxides. After UV exposure to an image, a mask produced from this mixture is developed in organic solvents (for example, butanone) and cured by heating.

EP-A 0,273,729 describes a photosensitive mixture for solder resist masks, which mixture can be developed with aqueous alkali and is produced essentially by reacting epoxidized phenolic resins with acrylic acid and maleic anhydride. The reaction product does not include any epoxy groups.

According to EP-A 0,280,295, aqueous alkali development capability of an exposed mask is achieved by copolymers which include N-isobutoxymethylacrylamide and methacrylic acid as co-components. The solder mask obtained can be post-cured thermally, but requires relatively long curing times at relatively high temperatures.

According to DE-A 3,114,931, a bis-epoxy compound is added to a photopolymerizable mixture for producing a solder resist mask and after development, the photocured image stencil is post-cured by heating. This process produces very temperature-resistant solder resist masks. However, the mixture does not contain any inorganic pigment.

EP-A 73,444 describes similar mixtures which have a good shelf life in the unexposed state. The mixtures include compounds which can be thermally crosslinked with a binder, a polymerization product of the ethylenically-unsaturated compound and/or with themselves. Preferably, those compounds are used which include, as crosslinking groups, epoxy groups or groups of the formula —$CH_2$—O—R, in which R is a hydrogen atom, or a lower alkyl, acyl or hydroxyalkyl group and in which the —$CH_2OR$ group is bonded to a nitrogen atom of a low-molecular-weight, open-chain or cyclic acid amide or to an aromatic carbon atom of a compound capable of condensing with formaldehyde.

The above-described mixtures however, have two critical disadvantages. First, under certain soldering conditions, threads or spherules of the soldering alloy continue to adhere to the surface of the solder resist mask after flow soldering, presumably as a consequence of layer softening. Under certain circumstances this may result in short circuits. As described in DE-A 3,236,560, the occurrence of these so-called "tin cobwebs" can be reduced, but not completely prevented, by roughening the photopolymer layer by means of a pigmented polyester film.

Second, the mixtures of EP-A 73,444 have an inadequate solvent resistance in the cured state. When the soldered conductor board is cleaned, softening of the solder resist masks may occur. In addition, with prolonged exposure times to solvents, for example ethanol, the dyestuff contained in the layer is dissolved partially out of the layer.

SUMMARY OF THE INVENTION

It is therefore an object of the present invention to provide a photopolymerizable mixture for producing a thermally post curable solder resist mask which can be deposited in the form of a solution or dispersion on a substrate, in particular, a printed circuit board. The photopolymerizable mixtures should have a high solids content, exhibit a good levelling when coated via conventional coating processes, have a good drying behavior, a high photosensitivity, a high resolution and a good soldering behavior. The deposited mixture should be capable of development in purely aqueous alkaline media and yield a solder mask with good mechanical, chemical and electrical properties.

It is a further object of the present invention to provide a process for producing such a solder mask.

Another object of the present invention is to provide a soldered printed circuit board, produced employing the above-described solder mask.

In accomplishing the foregoing objects there is provided according to the present invention a radiation-polymerizable mixture comprising:

(a) a first compound having at least two terminal ethylenically-unsaturated groups which are capable of forming a crosslinked polymer by a free-radical-initiated, addition-type chain polymerization;

(b) a polymeric binder which includes at least one unit each of methacrylic acid, a methacrylic acid ester and a styrene, wherein said styrene is present in an amount of about 40 to 65% by weight relative to the weight of said polymeric binder;

(c) a finely divided silicate- or silicic acid-based mineral pigment;

(d) a radiation-activatable polymerization initiator;

(e) a second compound having at least two epoxy groups in its molecule, and (f) a thermally activatable polyaddition initiator for epoxy groups.

There also is provided according to the present invention a process for producing a solder resist mask for a conductor board, which comprises the steps of depositing a solution or dispersion of the above-described mixture on the surface of a printed circuit board, drying the resultant coated printed circuit board, exposing said coated printed circuit board to actinic radiation to form an image, washing out the non-irradiated coated regions with a developer and heating the resultant solder mask to an elevated temperature.

Furthermore, there is provided according to the present invention a process for producing a soldered printed circuit board, which comprises subjecting the printed circuit board covered by the solder mask to at least one soldering process.

Further objects, features and advantages of the present invention will become apparent from the detailed description of preferred embodiments that follows.

BRIEF DESCRIPTION OF THE DRAWING

Exemplary embodiments of the present invention will hereinafter be described in conjunction with FIG. 1 which is a graph representing the comparative surface damage caused during soldering of conventional conductor boards and conductor boards according to the present invention.

DETAILED DESCRIPTION OF THE PREFERRED EMBODIMENTS

The radiation-polymerizable mixture according to the present invention comprises:

(a) a compound having at least two terminal ethylenically-unsaturated groups which are capable of forming a crosslinked polymer by a free-radical-initiated addition-type chain polymerization, (b) a polymeric binder which includes units of methacrylic acid, a methacrylic acid ester and a styrene, the latter in a proportion of 40 to 65% by weight, (c) a finely-divided mineral pigment based on silicic acid or a silicate, (d) a radiation-activatable polymerization initiator, (e) a compound having least two epoxy groups in its molecule, and (f) a thermally activatable polyaddition initiator for epoxy groups.

The process according to the present invention for producing a photoresist mask comprises depositing a solution or dispersion of a mixture of the above-described composition on the surface of a printed circuit and drying it, exposing the layer obtained to an image with actinic radiation, such that the soldering pads are not exposed, washing out the non-irradiated layer regions with a developer and heating the solder mask obtained to an elevated temperature.

The polymerizable compound (component(a)) preferably is an ester of acrylic or methacrylic acid formed with a polyhydric, preferably primary, alcohol. The alcohol preferably includes at least two hydroxyl groups since crosslinking according to the present invention typically is achieved by polyunsaturated compounds. The mixture may include an ester of a monohydric alcohol in minor amounts. Examples of advantageous polyhydric alcohols are ethylene glycol, propylene glycol, 1,4-butanediol, diethylene glycol, triethylene glycol, oligopropylene glycols, trimethylolethane, trimethylolpropane, pentaerythritol, dipentaerythritol, bisphenol-A bishydroxyethyl ether. The polymerizable compound also can be a low-molecular weight bisacrylate or bismethacrylate which has urethane groups and is obtained by reacting 2 mol of hydroxyalkyl acrylate or methacrylate with 1 mol of an aliphatic or cycloaliphatic diisocyanate, for example 2,2,4-trimethyl-hexamethylene diisocyanate. Such urethane group-containing monomers are described in U.S. Pat. No. 4,088,498. Particularly advantageous is an acrylate or methacrylate, especially the acrylate, having a high double bond content. Thus, a monomer containing 3 or more unsaturated groups is preferred. In general, an ester which includes at least one free hydroxyl group is also superior to the completely-esterified compound. The esters of trimethylolpropane, trimethylolethane, pentaerythritol and dipentaerythritol particularly are preferred. In general, the mixture contains the monomer or polymerizable compound in an amount of about 10 to 35%, preferably about 15 to 30%, by weight, based on the total content of nonvolatile components.

Typically, the polymeric binder (component (b)) consists of three components: a methacrylic acid, a methacrylic acid ester and a styrene. It may also include units of additional monomers such as an acrylic acid, an acrylic acid ester, acrylonitrile, methacrylonitrile, acrylamide, methacrylamide or a vinylheterocyclic in minor amounts. The methacrylic acid ester may be an alkyl ester having preferably 1 to 10, in particular, 1 to 7, carbon atoms in the alkyl group. The styrene may be an o-, m- or p-vinyltoluene, a vinylethylbenzene, α-methylstyrene or α-chlorostyrene, an o-, m- or p-chlorostyrene, a vinylanisole or the like. The unsubstituted styrene generally is preferred. The quantitative proportion of styrene units in the polymeric binder is from about 40 to 65%, preferably from about 45 to 55%, by weight; that of the methacrylic acid ester is from about 5 to 40%, preferably between 5 and 25% by weight. The methacrylic acid units should be present in an amount such that the acid number of the polymer is from 110 to 280, preferably from about 125 to 260. The proportion of styrene compound should, in particular, be in the specified range in order to achieve a good soldering stability. The quantitative proportion of the polymeric binder in the mixture is in general about 15 to 50%, preferably 20 to 40%, by weight.

Preferably, the mineral pigment (component(c)) is silicate- or silicic acid-based. It should be ground to a particle size such that at least about 90% of the particles have a diameter of about 5 μm or less. This imparts a smooth surface to the solder mask. Virtually all of these silicate minerals contain chemically-bound water in the form of OH groups on the silicon.

These OH groups are important; they make possible transverse crosslinking with the epoxides described below which is beneficial for the mechanical properties of the mask. For example, the following silicate minerals may be used according to the present invention: siliceous earths, feldspars, amphiboles, serpentine, zeolites, pumice and phonoliths. In these minerals, the $SiO_2$ content is usually above about 60%. Advantageously, aluminum, alkaline-earth metals and alkali metals function as counter-ions which are included in the crystal structure. The quantitative proportion of the pigment in the mixture is about 20 to 50%, preferably about 25 to 40%, by weight.

A large number of substances can be used as photoinitiators, e.g., benzoins; benzoin ethers; polynuclear quinones, such as 2-ethylanthraquinone; acridine derivatives, such as 9-phenylacridine or benzacridine, phenazine derivatives, quinoxaline derivatives, quinoline derivatives or acylphosphine oxide compounds. Photoinitiators of this type are described in DE 20 27 467, DE 20 39 861, DE 37 28 168, EP 0,011,786 and EP 0,220,589. Particular preference is given to photoinitiators possessing photocleavable trihalomethyl groups, especially to corresponding compounds of the triazine or thiazoline series.

The photoinitiators are generally employed in a quantity from about 0.1 to 15, and preferably from about 0.5 to 10, % by weight.

The mixture according to the present invention furthermore includes a dihydric or polyhydric epoxy compound (component (e)). Examples of preferred dihydric compounds include a bisglycidyl ether of a dihydric alcohol and/or a dihydric phenol, for example of bisphenol-A, polyethylene or polypropylene glycol ethers of bisphenol-A, 1,4-butanediol, 1,6-hexanediol, polyethylene glycol, polypropylene glycol or polytetrahydrofuran.

A bisglycidyl ether of a trihydric alcohol, for example of glycerol, may also be used. The epoxide is added to the mixture usually in an amount of about 10 to 30%, preferably about 12 to 25%, by weight, based on the nonvolatile components of the mixture.

Preferably, bisepoxides represented by the general formula $R_1$ is a hydrogen atom or a methyl group, $n_1$ and $n_2$ are numbers from 0 to 10, preferably from 0 to 5, and $n_3$ is a number from 0 to 4, preferably 0 or 1.

Preferred tri- and polyfunctional epoxides are, in particular, epoxidized phenol/formaldehyde resins containing chain segments represented by the general formula:

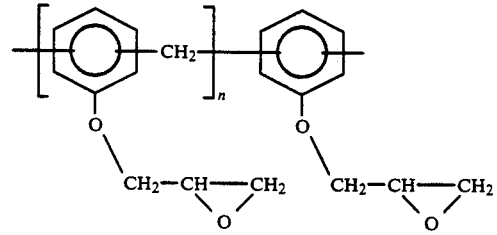

in which n is an integer which has at least the value of 2.

A further component (component (f)) included in the mixture is a thermally-sensitive hardener or addition initiator for epoxy groups. The hardener preferably is a basic nitrogen compound, for example triethylamine, 1,4-diazabicyclo[2.2.2]octane (Dabco), dibutylamine, higher alkylated aliphatic mono-, di- and triamines, and aliphatic/aromatic amines such as, for example, dimethylaniline. Tertiary, in particular aliphatic, amines are preferred. Especially preferred is diazabicyclooctane. The amount of the hardener or addition initiator in the mixture is in general between about 0.15 and 1.5%, preferably between about 0.2 and 1.0%, by weight.

Preferably, the mixture includes at least one dyestuff in order to render the developed resist stencil more visible. In this connection, a combination of at least two dyestuffs, one of which changes its color on irradiation and is destroyed, i.e. becomes colorless, at temperatures above 200° C. advantageously is used. The other dyestuff should survive both the irradiation and also temperatures above 200° C. without color alteration. It should make the solder resist mask clearly visible during soldering and thereafter. Dyestuffs preferable for this purpose are described in DE-A 3,114,931.

The mixture optionally may include a number of other conventional additives, for example inhibitors for preventing the thermal polymerization of the monomers, hydrogen donors, sensitometric regulators, pigments, plasticizers and thixotropic agents, in particular mineral pigments, such as $SiO_2$, or organic polymers, such as polyacrylamides. Thixotropic agents are advantageous, for example, for application by screen printing.

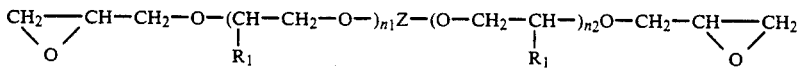

are used, in which

Z is an alkylene or hydroxyalkylene group having 2 to 6 carbon atoms or the group The mixture according to the present invention is only of limited durability in the ready-for-processing form; the individual components are therefore prefera-

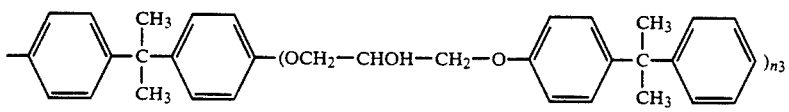

bly stored separately in at least two containers, i.e., a "two-component resist". Typically, all the components, with the exception of the epoxy compound (component (e)), are present in a main mixture to which the epoxide is added shortly before processing. The curing initiator, however, can also be kept as a separate component. Dyestuffs, mineral solids and other additives may also be present in separate mix components, with the result that a three-component system can also optionally be formulated. It is important that the submixtures have an adequately long shelf life (approximately 6 to 12 months) prior to their utilization in the mixing process.

The mixture according to the present invention is processed in a known manner, for example, by screen application. The dissolved or dispersed mixture is deposited on the conductor board workpiece through a screen cloth, clamped in a metal frame, of about 37 to 55 mesh per cm using a doctor blade. Another process that can be used is curtain coating. A continuously and vertically flowing liquid film is produced with the aid of a commercial curtain casting machine. The conductor board is passed under this film by means of a conveyor belt and consequently coated. The mixture may also be deposited by means of an electrostatic spray coating. In a closed booth, the solution is dispersed at a spray head into extremely fine drops and the latter are charged electrostatically by high voltage and deposited on the conductor board. The mixtures can also be processed by the dip-draw process and by roller application.

Solvent is removed from the coating mixtures processed by one of the above-described processes by drying in a circulating air oven or under an IR dryer. The conductor board coated in this way is then exposed through a master which protects from the irradiation those parts of the board which have to remain free for the soldering operation.

Any electromagnetic radiation whose energy can be used to activate a suitable polymerization initiator is suitable as actinic radiation to which the mixture according to the present invention is sensitive. Particularly preferred are visible and ultraviolet light, and x-ray, $\gamma$- and electron radiation. Laser radiation in the visible and UV region may also be used. Shortwave visible and near UV light is preferred.

The layers are developed in a known manner. Advantageous developers are aqueous, preferably aqueous alkaline solutions, for example, of alkali phosphates, alkali carbonates or alkali silicates, to which small amounts, for example up to about 10% by weight, of organic solvents or wetting agents which are miscible with water are added.

Fully developed solder masks are subjected to a thermal treatment before the soldering process. In the course of this, the carboxyl groups of the binder (component (b)) react with the polyfunctional epoxide (component (e)) to form an interpenetrating network. An integrating component of this network is also the mineral solid (component (c)) whose silicate OH groups contribute substantially to the curing of the mask by means of hydrogen bonds and covalent bonds.

The good mechanical, thermal and chemical properties of the solder resist masks become apparent with the application of the thermal post-treatment. This thermal treatment is carried out in general between about 80° C. and 150° C., with approximate treatment times of about 10 to 60 minutes. The ready-to-solder board can be fitted with electronic components in a known manner.

Then the conducting side of the board usually is normally treated with an appropriate commercial flux and subjected to flow soldering by means of a commercial flow soldering machine. The soldering agents used are known eutectic mixtures which permit soldering temperatures of about 230° to 260° C. A known mixture contains, for example, 63% by weight of tin and 37% by weight of lead. The solder resist masks produced according to the present invention can be used, in particular, in processes in which double-sided, plated-through conductor boards are soldered by immersion in liquid metal baths.

The mixtures according to the present invention yield solder resist layers which are advantageous due to their high flexibility and mechanical strength in the unexposed and exposed states, and to their high temperature resistance in the exposed and postcured state. The photopolymerizable layers in combination with the preferred photoinitiators have a high photosensitivity and result in a good overall hardening or overall crosslinking even in the case of high layer thickness. The exposed layers can be developed completely with aqueous alkali solutions even at layer thicknesses above 100 $\mu$m.

The exposed and developed layers can be cured thermally without excessive impairment of the flexibility of the mask or of its adhesion to the substrate and without alteration of the position and dimensions of the regions uncovered by development. The cured masks are resistant to atmospheric, thermal and chemical agents over prolonged periods of time. After the resist layer has been exposed, a high-contrast image is obtained in the layer. The solder resist masks obtained from the mixtures according to the present invention are suitable to a particular degree for effectively and permanently protecting sensitive electronic conductor structures against atmospheric attacks.

The following examples illustrate individual embodiments of the mixture according to the present invention. Unless otherwise specified, percentages and quantitative ratios are understood to be in weight units. Parts by weight (pbw) and parts by volume (pbv) are in the ratio of g to ml.

Example 1

Production of a ready-to-process solder resist mask (a) 320 pbw of styrene, 150 pbw of methacrylic acid, 30 pbw of n-hexyl methacrylate and 15 pbw of 2,2-azobisisobutyronitrile were dissolved in 450 pbw of 3-methoxy-1-but while stirring. ⅓ of this solution was heated to 90° C. in a round-bottomed flask while stirring and passing nitrogen through it. The exothermic polymerization which set in was kept at 90° C. to not more than 100° C. by external cooling. After the main reaction had died down, the remaining ⅔ of the solution was added uniformly over the course of 1½ hours and then the reaction solution was kept at 90° C. for a further 12 to 14 hours. The polymer solution was ready to use after cooling to room temperature.

The reduced specific viscosity of the product was 0.185 dl/g (measured on a 1%-strength solution in dimethylformamide at 25° C.).

(b) 112.5 pbw of pentaerythritol triacrylate,
128.9 pbw of trimethylolpropane triacrylate,
27.5 pbw of 9-phenylacridine,
12.4 pbw of Neozapon green, 1.2 pbw of a blue azo dyestuff obtained by coupling 2,4-dinitro-6-chloro-benzenediazonium salt with 2-methoxy-5-acetylamino-N,N-diethylaniline, and 2.5 pbw of triethylenediamine were dissolved in 123.9 pbw of 3-methoxy-1-butanol in a cylindrical vessel using a high speed stirrer. Then 396.7 pbw of a silicate pigment which is a natural agglomerate of corpuscular quartz and laminar kaolinite were interspersed in the stirred solution in the course of 30 minutes. The pigment includes over 80% $SiO_2$, and approximately 11% $Al_2O_3$; approximately 90% by weight of the particles have a particle size of less than 5 $\mu$m (Sillitin). 694.2 pbw of the polymer solution described above under (a) were then added to this suspension. The mixture, now provided with all the components, was homogenized well (1,200 rev/min) with the aid of a mixer, care being taken to ensure that the temperature did not rise above 50° to 55° C.

For the purpose of further homogenization, the viscous resist was ground in a glass ball mill and then filtered through a 160 $\mu$m V2A cloth pressure filter and bottled. As far as necessary, this mixture was diluted with methoxybutanol to a solids content of 68.6% by weight. It is denoted below as component A.

(c) 252 pbw of an epoxidized phenol/formaldehyde resin having an epoxide equivalent weight of 172 to 179 were dissolved in 148 pbw of 3-methoxybutanol in a cylindrical vessel by means of a horseshoe stirrer. After 15 minutes a clear solution having a solids content of 63% was obtained. This solution has been designated below as component B.

(d) 100 pbw of the component A were thoroughly mixed with 22.3 pbw of the component B using a suitable stirrer. The solder resist solution was then ready for use, that is to say for application to a conductor board by one of the processes mentioned above. The solids content was 67.5%.

(e) A 24×36 cm board composed of epoxy resin impregnated glass cloth and having a circuit pattern deposited on both sides, composed of 0.2 to 1.5 mm wide and 50 to 90 $\mu$m thick copper tracks and plated-through drill holes was plated over the entire surface with the solution described under (d) using a semiautomatic screen printing machine (Alfra Plan 50/70). To transfer the resist, a polyester screen open over the entire surface and having 43 meshes per cm was used; the rubber doctor blade, which had a Shore hardness of 70, was slightly rounded off at the pressure edge and the application angle was 15°. In this way it was possible to achieve coatings which were free of bubbles and color shadows and had an edge coverage of 15 to 20 $\mu$m. The conductor board coated in this manner was left for 5 minutes at room temperature and then dried for 7 minutes in a circulating air drying oven at 80° C. After being cooled to room temperature, the coated conductor board was exposed to an image through a film master.

The time of exposure to an iron-doped mercury high-pressure lamp was 25 s; a continuous-tone step wedge (Hoechst BK 02) placed on the solder resist for inspection purposes exhibited seven solid and one ghost wedge step after development. Development was carried out in a continuous spray system using a 1%-strength aqueous soda solution at 30° C. with a spraying pressure of 1.2 bar. The development time was 90 s; the unexposed layer regions were already uncovered by development after ⅔ of the developer path had been traversed.

After washing with water, the developed plate was dried in a hot air continuous dryer and then baked in a circulating air drying oven for 1 hour at 150° C. The fully cured board was then flow soldered and a second board which had been produced in the same way was hot-air levelled.

The soldering was carried out on a flow soldering machine. For this purpose, the boards were passed over an upstream foam fluxer (Alphagrillo TL 33), pre-dried and passed over a liquid solder composed of eutectic lead/tin alloy. The velocity was 0.9 m per minute and the soldering temperature 260° C. In order to remove the flux residues still adhering, washing was carried out for 3 minutes using a mixture composed of 65% trichlorotrifluoroethane and 35% 2-propanol and then for 3 minutes using pure trichlorotrifluoroethane. The soldering result of the conductor boards processed in this way was outstanding: the solder resist mask exhibited no attack of any kind and the surface was completely free of lead/tin residues, while the copper surfaces uncovered had perfect solder wetting.

With the second board, a hot-air levelling was carried out. For this purpose, the board was wetted with a water-soluble flux (Robertson SM 287) using a rubber roller and tinned by immersion in liquid solder and then blowing off with hot air. The solder temperature was 250° C., the temperature of the air emerging at high pressure at the two air knives was 260.C and the immersion time was set to 5 s. After washing with water and drying, this board also exhibited a completely satisfactory surface.

f) If the resist which is described under (d) and is directly suitable for screen application is applied by other processes, the solids content of 67.5% is too high. For example, if the mask is applied to the conductor board by means of a vertically falling curtain from the oblong slit of a curtain casting machine, the solid matter has to be reduced to approximately 58% by weight by diluting with methoxybutanol. Similar concentrations are necessary if the mask is sprayed onto the conductor board in a high voltage field by means of a rotating spraying head. These techniques also result in a very good envelopment of the conductor tracks by the mask which covers the board in an absolutely pore-free manner and with uniform thickness. Analogous processing to (e) results in the same good result: faultless copper sections which are uncovered by development and completely satisfactory surfaces by both of the soldering processes described under (e).

Examples 2 to 10

Table I below specifies 10 solutions of polymers which were produced similarly to the polymer of Example 1(a). The amounts are specified in percentages by weight.

TABLE I

| Example | Styrene | Methacrylic acid | Acrylic acid | n-hexyl methacrylate | Methyl methacrylate | Reduced specific viscosity (dl/g) |
|---|---|---|---|---|---|---|
| 1a | 55 | 35 | — | 10 | — | 0.185 |
| 2 (V) | 5 | 30 | — | 65 | — | 0.104 |

TABLE I-continued

| Example | Styrene | Methacrylic acid | Acrylic acid | n-hexyl methacrylate | Methyl methacrylate | Reduced specific viscosity (dl/g) |
|---|---|---|---|---|---|---|
| 3 | 60 | 20 | — | — | 20 | 0.165 |
| 4 (V) | 70 | 30 | — | — | — | 0.190 |
| 5 (V) | — | 35 | — | 50 | 15 | 0.176 |
| 6 | 45 | 35 | — | 20 | — | 0.192 |
| 7 | 65 | 30 | — | 5 | — | 0.188 |
| 8 (V) | 20 | — | 30 | 50 | — | 0.104 |
| 9 | 50 | 35 | — | 15 | — | 0.165 |
| 10 | 40 | 40 | — | 20 | — | 0.118 |

V = Comparison Example

Examples 11 to 24

Table II below summarizes 14 examples which do not differ in the technical implementation from Example 1 but have differences in formulation. Variations in the properties of the resist due to this are noted by means of keywords in Table II.

specified in Example 1(a)) and the parts by weight of the other components to the solvent-free solids.

Analogously to Example 1, the solids contents of the mixtures in Examples 11 to 24 were converted to a viscosity of 8.5 to 50 dPa.s by adding methoxybutanol. Generally, this is achieved, again analogously to Example 1, with solids contents of 58 to 68%.

TABLE II

| Example | Polymer from Ex. | pbw | Acrylate | pbw | Mineral | pbw | Phenyl acridine pbw |
|---|---|---|---|---|---|---|---|
| 11 (V) | 2 | 500 | X-400[1] | 167 | Aerosil | 286 | 16.9 |
| 12 (V) | 3 | 500 | Hexanediol dimethacrylate | 120 | Calcium carbonate | 250 | 17.5 |
| 13 (V) | 4 | 500 | X-400 | 167 | Sillitin | 280 | 16.9 |
| 14 (V) | 5 | 500 | Pentaerythritol triacryalte | 167 | Sillitin | 286 | 16.9 |
| 15 | 6 | 500 | Pentaerythritol tetraacrylate | 167 | Sillitin | 286 | 16.9 |
| 16 | 7 | 500 | Pentaerythritol triacrylate | 167 | Sillitin | 286 | 16.9 |
| 17 (V) | 8 | 500 | X-400 | 167 | Barium sulfate | 286 | 16.9 |
| 18 | 9 | 500 | Pentaerythritol triacrylate | 167 | Sillitin | 286 | 16.9 |
| 19 | 10 | 500 | Trimethylolpropane triacrylate | 167 | Sillitin | 220 | 25.4 |
| 20 | 1 | 500 | Pentaerythritol triacrylate | 250 | Sillitin | 286 | 16.9 |
| 21 (V) | 1 | 500 | Pentaerythritol triacrylate | 167 | Titan-dioxide | 286 | 17.0 |
| 22 (V) | 1 | 500 | Pentaerythritol triacrylate | 167 | Sillitin | 286 | 16.9 |
| 23 (V) | 1 | 500 | Pentaerythritol triacrylate | 167 | Sillitin | 286 | 16.9 |
| 24 | 1 | 500 | X-400 | 167 | Sillitin | 286 | 16.9 |
| 25* | 1 | 500 | Pentaerythritol triacrylate | 169 | Sillitin | 286 | 16.9 |

| Example | Amine | pbw | Epoxide | pbw | Notes |
|---|---|---|---|---|---|
| 11 (V) | Dabco[2] | 1.8 | EP 140[3] | 150 | Sticky after development |
| 12 (V) | Dabco | 1.8 | EP 140 | 150 | Sticky surfaces during processing |
| 13 (V) | Dabco | 1.8 | EP 140 | 150 | Soft surface |
| 14 (V) | Dabco | 1.8 | Ep 140 | 63 | |
| 15 | Dabco | 1.8 | Ep 140 | 160 | Not possible to develop without haze |
| 16 | Dabco | 1.8 | EP 140 | 150 | |
| 17 (V) | Dabco | 3.5 | DEN 431[4] | 130 | Reduced photosensitivity |
| 18 | Dabco | 1.8 | EP 140 | 110 | |
| 19 | Triethylamine | 2.5 | DEN 431 | 135 | Residual haze after development |
| 20 | Dabco | 2.1 | EP 140 | 120 | Sticky surfaces |
| 21 (V) | Tributylamine | 3.5 | DEN 431 | 150 | Brittle surface after curing |
| 22 (V) | Dabco | 10.5 | EP 140 | 150 | Inadequate "pot lives" |
| 23 (V) | Dabco | 0.7 | EP 140 | 150 | Poor solvent resistance: Methylenechloride |
| 24 | Dabco | 1.8 | EP 140 | 90 | Low resistance in developer |
| 25* | Dabco | 1.8 | EP 140 | 150 | Pronounced thixotropizing behavior |

*Further component in this example: 54 pbw of a 30%-strength solution of a low-molecular-weight polyacrylamide in an inorganic solvent (Thixatrol ® SR)
[1] X-400: dimethacrylate of polyethylene glycol with a mean molecular weight of 400
[2] 1,4-diazabicyclo[2.2.2]octane (triethylene diamine)
[3] EP 140: Beckopox EP 140, Hoechst AG, diepoxide on a bisphenol-A basis. expoxide equivalent weight 180–192
[4] DEN 431: epoxidized phenyl/formaldehyde resin supplied by Dow Chemical Co., epoxy equivalent 172–179
(V) Comparison example The specific behavior of the experimental boards in the hot-air levelling process as described under 1(e) is shown graphically in FIG. 1. In the latter, the damaged proportion of the surface (front and rear side) of individual boards is specified in %. The surface damage relates primarily to solder residues in the form of spherules, cobweb-like threads and nets.

The dyestuffs mentioned in Example 1 were used in the same amount as in the latter case. The parts by weight of the polymers relate to 50%-strength solutions in methoxybutanol (equivalent to the concentration

What is claimed is:
1. A radiation-polymerizable mixture comprising:
   (a) a first compound having at least two terminal ethylenically-unsaturated groups which are capable of forming a crosslinked polymer by a free-radical-initiated, addition-type chain polymerization;
   (b) a polymeric binder consisting of:
      (1) at least one unit of a methacrylic acid,
      (2) at least one unit of a methacrylic acid ester,
      (3) at least one unit of a styrene selected from the group consisting of styrene, o-, m- or p-vinyltoluene, a vinylethylbenzene, a α-methylstyrene, a

α-chlorostyrene, an o-, m-, or p-chlorostyrene and a vinylanisole, and (4) an optional monomer selected from the group consisting of an acrylic acid, an acrylic acid ester, acrylonitrile, methacrylonitrile, acrylamide, methacrylamide and a vinylheterocyclic compound, wherein said styrene is present in an amount of about 40 to 65% by weight and said methacrylic acid ester is present in an amount of about 5 to 40% by weight, in each case relative to the weight of said polymeric binder and wherein said methacrylic acid is present in an amount sufficient to confer an acid number from 110 to 280 to said polymeric binder;

(c) from 20 to 50% of a finely divided silicate- or silicic acid-based mineral pigment;

(d) from 0.1 to 15% of a radiation activatable polymerization initiator;

(e) from 10 % to 30% of a second compound having at least two epoxy groups in its molecule; and (f) from 0.2 to 1.0% of a thermally activatable polyaddition initiator for epoxy groups the percentages of components (a), (b), (c), (d), (e) and (f) being based on the total amount of non-volatile ingredients of the mixture.

2. A radiation-polymerizable mixture as recited in claim 1, further comprising a dyestuff.

3. A radiation-polymerizable mixture as recited in claim 2, wherein said dyestuff comprises a mixture of at least two dyestuffs, one of which changes its color on irradiation and is destroyed.

4. A radiation-polymerizable mixture as recited in claim 1, wherein said component (a) comprises a compound selected from the group consisting of an ester of acrylic or methacrylic acid formed with a polyhydric alcohol and a low molecular weight bisacrylate or bismethacrylate which has urethane groups and is a reaction product of hydroxyalkyl acrylate or methacrylate with an aliphatic or cycloaliphatic diisocyanate.

5. A radiation-polymerizable mixture as recited in claim 1, wherein said methacrylic acid ester included in said component (b) comprises an alkyl ester having 1 to 10 carbon atoms in the alkyl group.

6. A radiation-polymerizable mixture as recited in claim 1, wherein said optional monomer of component (b) consists of at least one monomer selected from the group consisting of an acrylic acid, acrylic acid ester, acrylonitrile, methacrylonitrile, acrylamide, methacrylamide and a vinylheterocyclic.

7. A radiation-polymerizable mixture as recited in claim 1, wherein said component (c) comprises a pigment derived from a mineral selected from the group consisting of a siliceous earth, feldspar, amphibole, serpentine, zeolite, pumice and phenolith.

8. A radiation-polymerizable mixture as recited in claim 1, wherein said component (c) is ground to a particle size such that at least about 90% of the particles have a diameter of about 5 $\mu$m or less.

9. A radiation-polymerizable mixture as recited in claim 1, wherein said component (e) comprises an epoxy compound selected from the group consisting of a bisgylcidyl ether of a dihydric alcohol or a dihydric phenol, a polyethylene or polypropylene glycol ether of bisphenol-A, 1,4-butanediol, 1,6-hexanediol, polyethylene glycol, polypropylene glycol or polytetrahydrofuran and a bisgylcidyl ether of a trihydric alcohol.

10. A radiation-polymerizable mixture as recited in claim 1, wherein said component (f) comprises an organic amine.

11. A radiation-polymerizable mixture as recited in claim 10, wherein said organic amine is selected from the group consisting of triethylamine, diazabicyclooctane, dibutylamine and dimethylaniline.

12. A radiation-polymerizable mixture as recited in claim 1, wherein said component (d) comprises a photoinitiator having a photocleavable trihalomethyl group.

13. A radiation-polymerizable mixture as recited in claim 1, further comprising an additive selected from the group consisting of inhibitors, hydrogen donors, sensitometric regulators, pigments, plasticizers, thixotropic agents, and mixtures thereof.

14. A radiation-polymerizable mixture as recited in claim 1, which is produced by mixing two separate components, one comprising component (e), and one comprising components (a), (b), (c), (d), and (f).

15. A radiation-polymerizable mixture as recited in claim 1, which is produced by mixing component (e) with a preformed mixture of components (a), (b), (c), (d), and (f).

16. A radiation-polymerizable mixture as recited in claim 1 comprising essentially of the claimed ingredients.

17. A radiation-polymerizable mixture as recited in claim 1, wherein said methacrylic acid ester in said polymeric binder is present in an amount of about 5 to 25% by weight.

18. A radiation-polymerizable mixture as recited in claim 17, comprising about 25 to 40% by weight of component (c).

* * * * *

UNITED STATES PATENT AND TRADEMARK OFFICE
CERTIFICATE OF CORRECTION

PATENT NO. : 5,264,324
DATED : November 23, 1993
INVENTOR(S) : Emmelius et al.

It is certified that error appears in the above-identified patent and that said Letters Patent is hereby corrected as shown below:

At column 8, line 51, "3-methoxy-1-but" should be -- 3-methoxy-1-butanol --.

At column 8, line 56, "3/4" should be -- 2/3 --.

At column 10, line 5, "3/4" should be -- 2/3 --.

At column 10, line 34, "260.C" should be -- 260° C. --.

At column 14, line 41, "comprising" should be -- consisting --.

Signed and Sealed this

Fourteenth Day of June, 1994

Attest:

BRUCE LEHMAN

Attesting Officer   Commissioner of Patents and Trademarks